United States Patent [19]

Campione

[11] Patent Number: 4,701,644
[45] Date of Patent: Oct. 20, 1987

[54] LOW POWER SENSE AMPLIFIER

[75] Inventor: Ben Campione, Palm Bay, Fla.

[73] Assignee: Harris Corporation, Melbourne, Fla.

[21] Appl. No.: 896,103

[22] Filed: Aug. 13, 1986

[51] Int. Cl.[4] .................. H03K 3/356; H03K 17/16
[52] U.S. Cl. ................................. 307/530; 307/279; 307/355; 365/205; 365/208
[58] Field of Search ............... 307/530, 355, 279, 291, 307/451–452; 365/189, 190, 205, 207, 208

[56] References Cited

U.S. PATENT DOCUMENTS

| | | | |
|---|---|---|---|
| 3,953,839 | 4/1976 | Dennison et al. | 365/190 X |
| 4,053,873 | 10/1977 | Freeman et al. | 307/530 X |
| 4,146,802 | 3/1979 | Moench | 307/279 |
| 4,238,841 | 12/1980 | Clemen et al. | 307/530 X |
| 4,412,143 | 10/1983 | Patella et al. | 307/530 |
| 4,461,965 | 7/1984 | Chin | 307/530 |
| 4,479,202 | 10/1984 | Uchida | 307/530 X |
| 4,601,017 | 7/1986 | Mochizuki et al. | 307/530 X |

FOREIGN PATENT DOCUMENTS 0074197 4/1985 Japan ................... 365/190

OTHER PUBLICATIONS

Chao et al, "CMOS Sense-Restore Circuits for One-Device FET Dynamic RAM", IBM T.D.B., vol. 25, No. 10, Mar. 1983, pp. 5088–5091.
Chang, "Dynamic Differential Sense Amplifier Register", IBM T.D.B., vol. 24, No. 4, Sep. 1981, pp. 2199–2200.

Primary Examiner—Stanley D. Miller
Assistant Examiner—D. R. Hudspeth
Attorney, Agent, or Firm—Barnes & Thornburg

[57] ABSTRACT

A low power sense amplifier having bit line sensors for sensing the respective voltage levels of a plurality of bit lines, and a latch connected by data lines to the bit lines sensor, for latching the sensed voltage levels. Circuitry of the amplifier prevents formation of a conductive path to ground through both the bit line sensors and the latch when the sensed voltage levels are latched. This provides a sense amplifier which is low in power consumption, while maintaining a relatively high speed, which is particularly useful in CMOS memories.

16 Claims, 3 Drawing Figures

LOW POWER SENSE AMPLIFIER

BACKGROUND AND SUMMARY OF THE INVENTION

The present invention relates generally to sense amplifiers, and specifically, to low power sense amplifiers for CMOS memories.

Most CMOS memories use a differential type sense amplifier as illustrated in FIG. 1. Advantages of the differential type sense amplifier are its high speed and its sensitivity to the small voltage changes between the bit lines. However, a major drawback of this type of amplifier is its high current consumption. This makes the use of a differential type sense amplifier undesirable in a CMOS memory, since a main advantage of CMOS technology is its low power comsumption. This problem is exacerbated for large word memories where each bit in a word requires a sense amplifier.

Some CMOS memories use cross-coupled sense amplifier latches as illustrated in FIG. 2 which do not use current in some situations. However, these cross-coupled sense amplifier latches are considerably slower than the differential type sense amplifier.

Thus, an object of the present invention is to provide a sense amplifier for use in a memory device which has low power consumption, yet is not significantly slower than the high power differential type sense amplifier.

Another object of the present invention is to provide a sense amplifier which is CMOS compatible.

A further object of the present invention is to provide a sense amplifier which consumes relatively little power, but has isolation between the data and bit lines.

This object and other objects of the present invention are attained by providing a sense amplifier with bit line sensors for sensing the voltage levels of a pair of bit lines, and a latch connected by data lines to the bit line sensors for latching the sensed voltage levels. Also provided is a means for preventing the formation of a conductor path to ground simultaneously through both the bit line sensors and the latch when the sensed voltage levels are latched. In preferred embodiments, means for isolating the bit lines from the data lines is provided.

By preventing formation of a conductor path to ground simultaneously through both the bit line sensing means and the latch means, current is not drawn in a fixed state. This reduces the operating power substantially. In providing bit line isolation, some speed is gained so that the overall speed of a memory device using the present invention is not significantly slower than one using a differential sense amplifier. In other words, the present invention sacrifices some speed in order to reduce operating power. However, the present invention is still faster than cross-coupled sense amplifier latches since the matrix cell devices attached to the bit lines must work against the cross-coupled sense amplifier latches.

Other objects, advantages, and novel features of the present invention will be become apparent from the following detailed description of the invention when considered in conjunction with the accompanying drawings.

DETAILED DESCRIPTION OF THE DRAWINGS

Figure 1:
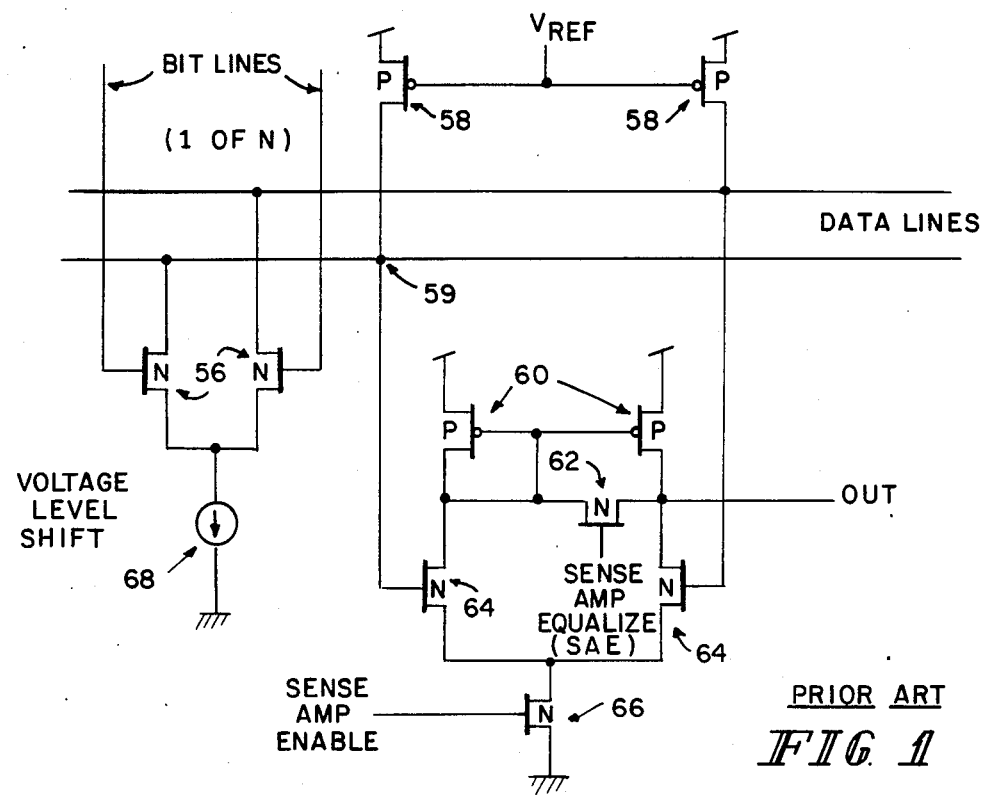
FIG. 1 is an example of a prior art differential type sense amplifier.

FIG. 1 shows a prior art device using a differential type sense amplifier. As can be seen from this schematic, current is able to flow to the ground from the supply voltage when the amplifier is in a fixed state. The current paths include the current source 68. Also, devices 56 and 58 provide a path to ground when a column is selected. This is due to the bit lines being charged high between read operations, so that devices 58 turn on partially and draw current from devices 56.

When $V_{REF}$ is at a specified voltage, devices 58 are on. This allows 64 to conduct current drawn from the p-channel devices 60. Both sides of the amplifier are equalized by device 62. Thus, when the sense amplifier is enabled through device 66, a current path to ground is provided through devices 60, 64, and 66. Also, if the data is such that node 59 is high during a read, then that side of the differential amplifier turns on and provides a current path by pulling the gates of devices 60 low. As noted earlier, while providing speed, the differential-type sense amplifier as described above has high power consumption, making it less desirable in CMOS applications.

Figure 2:
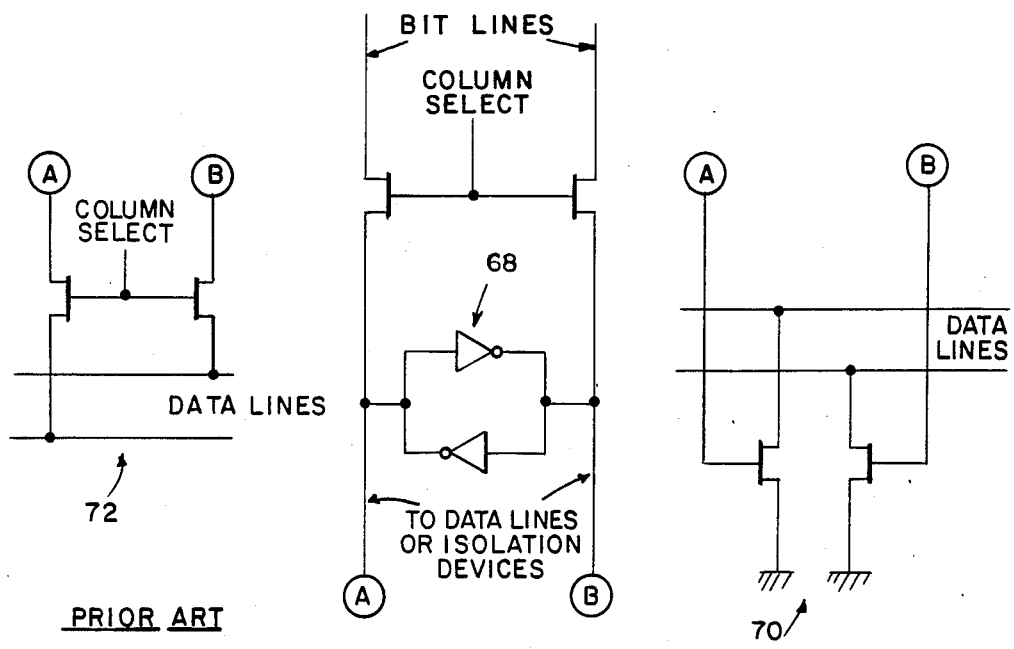
FIG. 2 is an example of a prior art cross-coupled sense amplifier latch.

FIG. 2 shows a prior art device using a cross-coupled sense amplifier latch. While this circuit does not allow the supply voltage to flow current to ground when in a fixed state due to the bit line isolation devices 70 or 72 which are in the path to the data lines, it is too slow since the matrix cell devices attached to the bit lines work against the latch when data is switched. Since the matrix cell devices are very small, they cannot provide enough current to quickly switch the cross-coupled latch. Thus, although low in power consumption, this arrangement is too slow.

Figure 3:
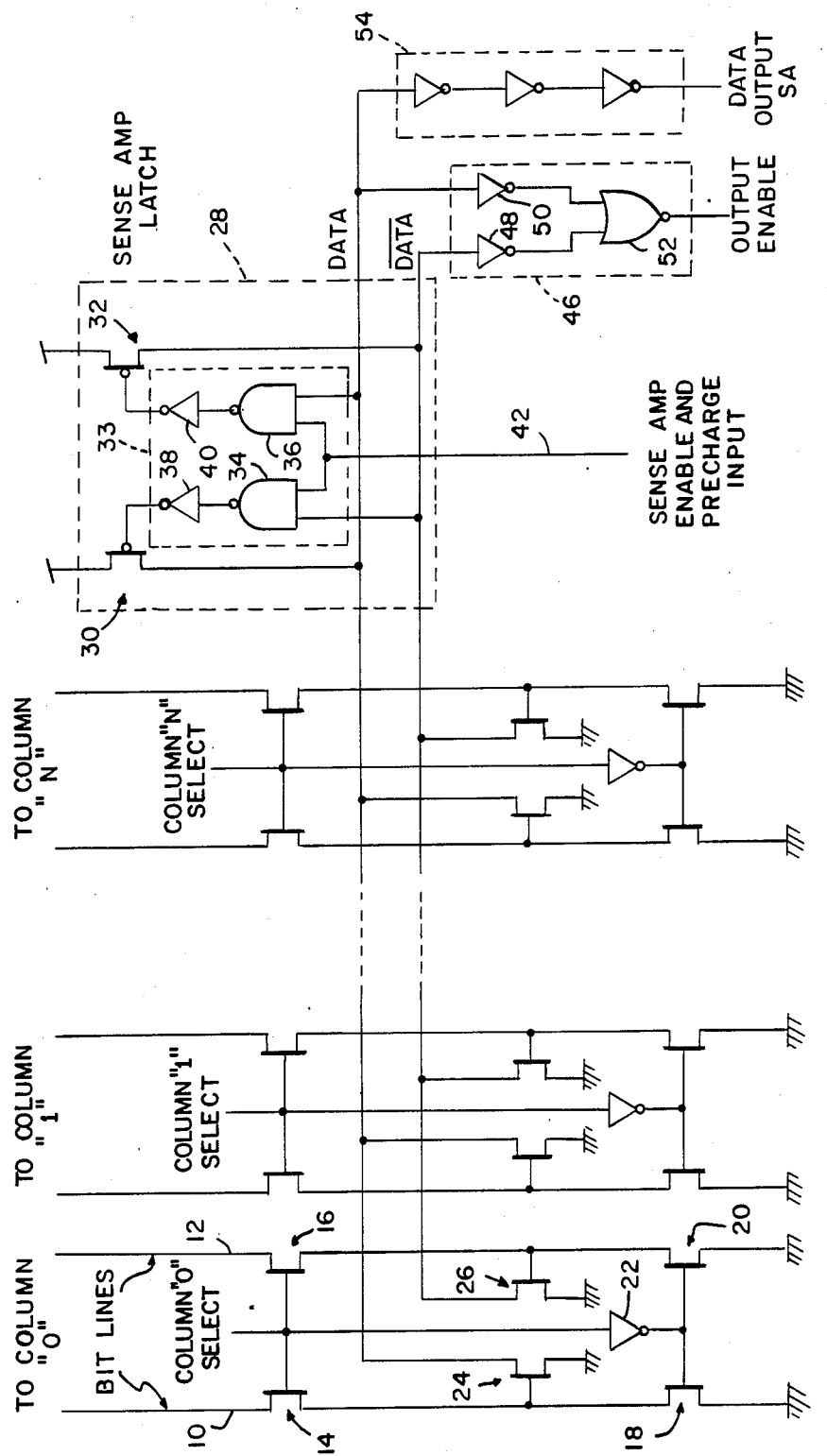
FIG. 3 represents a schematic and logic diagram of a low power sense amplifier incorporating the principles of the present invention.

Referring to FIG. 3, a preferred embodiment of the present invention shows a logic diagram of a low power sense amplifier.

In a memory matrix, a number of pairs of bit lines are shown representing columns O through N. Only the sense amplifier of bit lines for column "O" will be described, since the remaining columns are similar. The bit lines 10, 12 for column "O" are connected to the drain of N-channel devices 14 and 16. In turn, the sources of devices 14 and 16 are connected respectively to the drains of N-channel devices 18 and 20, the sources of which are connected to ground. The column "O" select line is connected to the gates of devices 14, 16 and connected through an inverter 22 to the gates of devices 18, 20.

A third pair of gate devices 24, 26 have their gates connected between the sources of devices 14, 16 and the drains of devices 18, 20. The drains of devices 24, 26 are connected to Data and $\overline{\text{Data}}$ lines, while their sources are connected to ground. Devices 24, 26, also shown as N-channel devices, provide bit line to data line isolation.

Prior to selecting a column, the column select line is low. The inverter 22 pulls the gates of devices 18, 20 to a logic high turning them on, and this in turn pulls the gates of devices 24, 26 to a logic low. In this way, the gates of devices 24, 26 are discharged prior to the sensing of the matrix location between each column select and the devices 24, 26 are held off. This prevents the storing of charge on the gates of devices 24, 26, one of which was previously pulled to a logic high by its appropriate bit line. Otherwise, the stored charge would have to be discharged through one of the bit lines, thereby slowing down its selection. By this arrangement, the bit lines are discharged and isolated from the data lines.

When column select is high, inverter 22 pulls the gates of devices 18, 20 to a logic low, turning them off. This releases the gates of devices 24, 26 and allows the bit lines to pull the gates of devices 24, 26 to their respective voltage levels, so that one of the devices 24, 26 will turn on while the other will remain off.

Connected to the Data and $\overline{\text{Data}}$ lines in a sense amplifier latch 28. This sense amplifier latch has two P-channel devices 30, 32, the drains which are connected respectively to the Data and $\overline{\text{Data}}$ lines and their sources of which are connected to a logic high voltage. Connected to the gates of the P-channel devices 30, 32 is logic circuitry 33 comprising a separate branch for each device 30, 32. Each branch has a NAND gate 34, 36, connected to either the Data and $\overline{\text{Data}}$ line, respectively, in series with an inverter 38, 40 which is to the gate of the respective device 30, 32. Both NAND gates 34, 36 also receive a second input, namely a sense amplifier enable and precharge input (SAEPI) 42.

The logical circuitry 33 formed by NAND gates 34, 36 and inverters 38, 40 provide a logical low at the gates of the P-channel devices 30, 32 whenever either the sense amplifier enable and precharge input is a logic low or either of the Data or $\overline{\text{Data}}$ lines are a logic low. Alternative embodiments of the logic circuity 33 are contemplated, in addition to the embodiment illustrated in FIG. 1.

Prior to the column selection, SAEPI is a logic low. This holds the gates of the P-channel devices 30, 32 low via logic circuitry 33, allowing them to conduct pulling both the Data and $\overline{\text{Data}}$ lines up to the supply voltage. Just before a column is selected, SAEPI is set to a logic high. This turns off devices 30, 32 via logic circuity 33 and briefly allows the Data and $\overline{\text{Data}}$ lines to float at the supplied voltage. Once a column is selected, inverter 22 pulls devices 18 and 20 low, to release the gates of devices 24, 26. Either Data or $\overline{\text{Data}}$ line is pulled low, and the sense amplifier latch 28 turns on the P-channel device 30 or 32 which is attached to the line which has remained high. This keeps either the Data or $\overline{\text{Data}}$ line high and the other low, so that the data stored in the matrix cell is now on the Data line.

As an example, assume bit line 10 is high, and bit line 12 is low. When column "O" is selected, turning on device 14, 16, device 24 will turn on and device 26 will remain off. This pulls the Data line low from the high voltage at which it had been floating. The $\overline{\text{Data}}$ line remains at a high. Since the Data line is low, the voltage at the gate of device 32 is a logic low irrespective of the SAEPI input and NAND gate 36 so that device 32 is conducting. This keeps the $\overline{\text{Data}}$ line at a logic high. The high input from the SAEPI and $\overline{\text{Data}}$ line to NAND gate 34 assures a logic high at device 30, thereby turning the P-channel device off, so that the Data line will not be pulled up to a high and will remain discharged or logic low. In this way, the information on the Data and the $\overline{\text{Data}}$ lines will remain latched. The data stored in the matrix cell is now on the Data line and is available at a data output 44.

As can be gathered from the above description, when the sense amplifier is in a fixed state, either device 24 or series device 30 will be off while the other is conducting, and either device 26 or series device 28 will be conducting while the other is off. This assures that there is no conductive path from the supply voltage to ground, and thereby prevents draw of current in a fixed state.

The Data and $\overline{\text{Data}}$ lines are shown in FIG. 3 connected to an output enable 46. The embodiment illustrated in FIG. 3 of the output enable 46 shows inverters 48, 50 connected to the Data and $\overline{\text{Data}}$ lines respectively. The outputs of the inverters 48, 50 are connected to the inputs of a NOR gate 52 which provides an output enable signal.

When both the Data and $\overline{\text{Data}}$ lines are at a logic high, the output enable is at a high also. When a column is selected and either the Data or $\overline{\text{Data}}$ line is pulled low, the output enable is also pulled low. The output enable can thus be used to automatically tristate the output buffer when data is not selected.

As shown in FIG. 3, the data output 54 has three inverters. These serve to invert the signal on the Data line, which is the bit line signal that had been inverted by device 24. Thus, the true bit line signal is available at the data output due to the triple inversion.

The arrangement shown in FIG. 3 shows that a single sense amplifier latch can be used to latch data from a plurality of sense amplifiers, although only the latching of the data from one amplifier has been described above.

From the preceding description of the preferred embodiments, it is evident that the objects of the invention are attained and although the invention has been described and illustrated in detail, it is to be clearly understood that the same is by way of illustration and example only and is not to be taken by way of limitation. The spirit and scope of this invention are to be limited only by the terms of the appended claims.

What is claimed is:

1. A sense and latch circuit for a memory device having at least a pair of bit lines, comprising:
    first switching means connected to a reference level and a pair of bit lines for sensing the signal levels of said pair of bit lines;
    second switching means connected by data lines to said first switching means for latching the sensed signal levels; and
    control means connected to said first and second switching means for controlling said first and second switching means such that a conductive path to said reference level through both said first and second switching means is prevented when said sensed signal levels are latched.

2. A sense and latch circuit according to claim 1, further comprising data lines connected to said first and second switching means, and bit line isolation means connected to said data lines and said bit lines and which includes said first switching means for isolating the data lines from said bit lines.

3. A sense and latch circuit according to claim 2, wherein said first switching means includes two first gate devices each having a source, gate and drain; wherein said sources of each of said first gate devices are connected respectively to one of the pair of said data lines, said gates are selectively connected to one of the pair of said bit lines, and said drains are connected to said reference level.

4. A sense and latch circuit according to claim 3, further comprising second gate devices connected between said bit lines and said first gate devices for selectively connecting the gate of each of said first gate device to a respective bit line.

5. A sense and latch circuit according to claim 4, further comprising discharge means connected to said first gate devices and said reference level for discharging the first gate devices and for subsequently allowing said first gate devices to sense signal levels on said bit lines.

6. A sense and latch circuit according to claim 5, wherein said discharge means includes a pair of third gate devices each having a source, gate and drain; with their sources respectively connected to the gates of the first gate devices and their drains connected to ground.

7. A sense and latch circuit according to claim 6, wherein said discharge means further includes an inverter connected to the gates of said third gate devices for receiving a preinverted signal and supplying an inverted signal for controlling said third gate devices, and wherein the preinverted signal controls the gates of said second gate devices.

8. a sense and latch circuit according to claim 1, wherein said second switching means includes a pair of second gate devices connected between data lines and a logic level voltage, and said first switching means includes a pair of first gate devices connected between said data lines and said reference level.

9. A sense and latch circuit according to claim 8, wherein said second gate devices are P-channel FET transistors each having a source, gate and drain, and said first gate devices are N-channel FET transistors, wherein the gates of said second gate devices are connected to said control means for controlling said second gate devices, the drains of said second gate devices are connected respectively to said data lines, and the sources of said second gate devices are connected to said logic level voltage, and wherein the gates of said first gate devices are selectively connected to one of the pair of said bit lines, the drains of said first gate devices are respectively connected to one of the pair of said data lines, and the sources of said first gate devices are connected to said reference level.

10. A sense and latch circuit according to claim 9, wherein said control means includes logic circuit means connected to each said gate of said second gate devices and which includes a NAND gate cascaded in series with an inverter, said logic circuit means having as inputs signals from one of said data lines and a sense amplifier enable and precharge input line, which enables and precharges the logic circuit means.

11. A sense and latch circuit according to claim 1, further comprising an output enable means connected to said data lines and an output buffer for tristating said output buffer when data is not selected.

12. An arrangement of sensing and latching data on a pair of bit lines in a memory device, said arrangement comprising:
  sense amplifier means connected to said bit lines for sensing the voltage levels of said bit lines;
  column select means for selecting a specific pair of bit lines to be sensed from a plurality of pairs of bit lines;
  sense amplifier clearing means connected to said sense amplifier means and said column select means for clearing the sense amplifier means of charge prior to the selection of said specific pair of bit lines; and
  latch means connected to said sense amplifier means by data lines for latching said sensed voltage levels;
  wherein the sense amplifier means and the latch means are configured such that no conductive path to a reference level is formed through said sense amplifier means and said latch means when said sensed voltage levels are latched.

13. An arrangement according to claim 12, wherein said sense amplifier means includes means connected to said pair of bit lines for isolating said pair of bit lines and said data lines.

14. An arrangement according to claim 12, wherein said latch means includes logic means connected to said data lines to precharge said data lines in response to a precharge signal.

15. An arrangement according to claim 14, wherein said logic means monitors said data lines and latches one of said data lines high.

16. An arrangement according to claim 15, wherein said sense amplifier means discharges one of said data lines, and the logic means latches the other said data line high.

* * * * *